United States Patent
Ruckerbauer et al.

(10) Patent No.: US 7,342,815 B2
(45) Date of Patent: Mar. 11, 2008

(54) DQS SIGNALING IN DDR-III MEMORY SYSTEMS WITHOUT PREAMBLE

(75) Inventors: Hermann Ruckerbauer, Moos (DE); Georg Braun, Holzkirchen (DE); Amir Motamedi, München (DE)

(73) Assignee: Infineon Technologies, AG, Neubiberg (DE)

( * ) Notice: Subject to any disclaimer, the term of this patent is extended or adjusted under 35 U.S.C. 154(b) by 158 days.

(21) Appl. No.: 11/214,067

(22) Filed: Aug. 30, 2005

(65) Prior Publication Data

US 2006/0062039 A1 Mar. 23, 2006

(30) Foreign Application Priority Data

Aug. 31, 2004 (DE) .................. 10 2004 042 173

(51) Int. Cl.
*G11C 5/06* (2006.01)

(52) U.S. Cl. ............... 365/63; 365/51; 365/52

(58) Field of Classification Search ............ 365/63, 365/51, 52, 198; 326/82, 30
See application file for complete search history.

(56) References Cited

U.S. PATENT DOCUMENTS

| | | | | |
|---|---|---|---|---|
| 6,809,546 B2* | 10/2004 | Song et al. | ............ | 326/30 |
| 6,838,907 B1* | 1/2005 | Artsi | ............ | 326/82 |
| 7,012,449 B2* | 3/2006 | Lee et al. | ............ | 326/82 |
| 7,154,295 B2* | 12/2006 | Choe | ............ | 326/30 |
| 7,208,973 B2* | 4/2007 | Kwon | ............ | 326/30 |
| 2003/0080774 A1* | 5/2003 | Funaba | ............ | 326/30 |
| 2004/0100837 A1 | 5/2004 | Lee | | |

* cited by examiner

*Primary Examiner*—Anh Phung
*Assistant Examiner*—Dang Nguyen
(74) *Attorney, Agent, or Firm*—Edell, Shapiro & Finnan, LLC

(57) ABSTRACT

A data transmission system, particularly as part of a DDR-III memory chip communication circuit, performs a data transmission operation without preamble. The data transmission system includes at least one data line with an on die termination that can be turned on and turned off, and the chip end of the data line is connected to a positive or to a less positive, grounded, or negative supply voltage line by a pull-up or pull-down resistor. Alternatively, a data transmission system is operated with a timing by which the termination circuits to be turned on for respective operating state are not turned on until the drivers to be activated for the respective operating state have been activated.

12 Claims, 3 Drawing Sheets

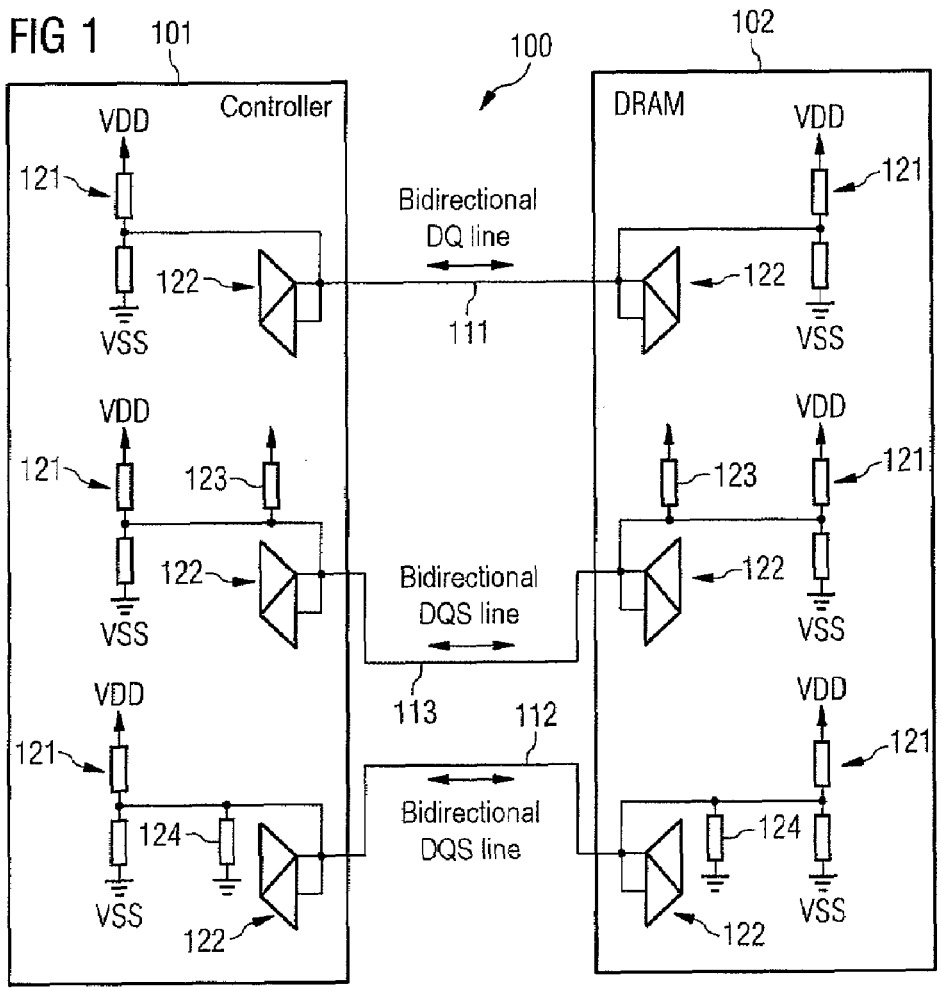
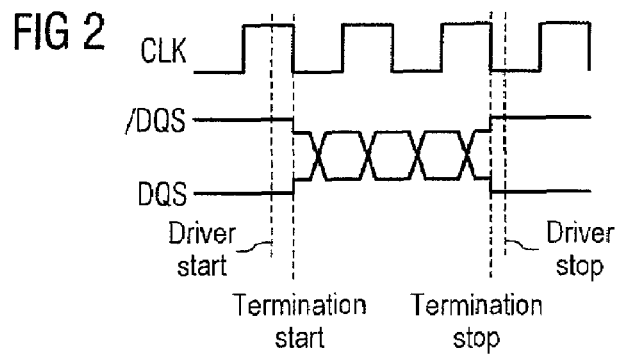

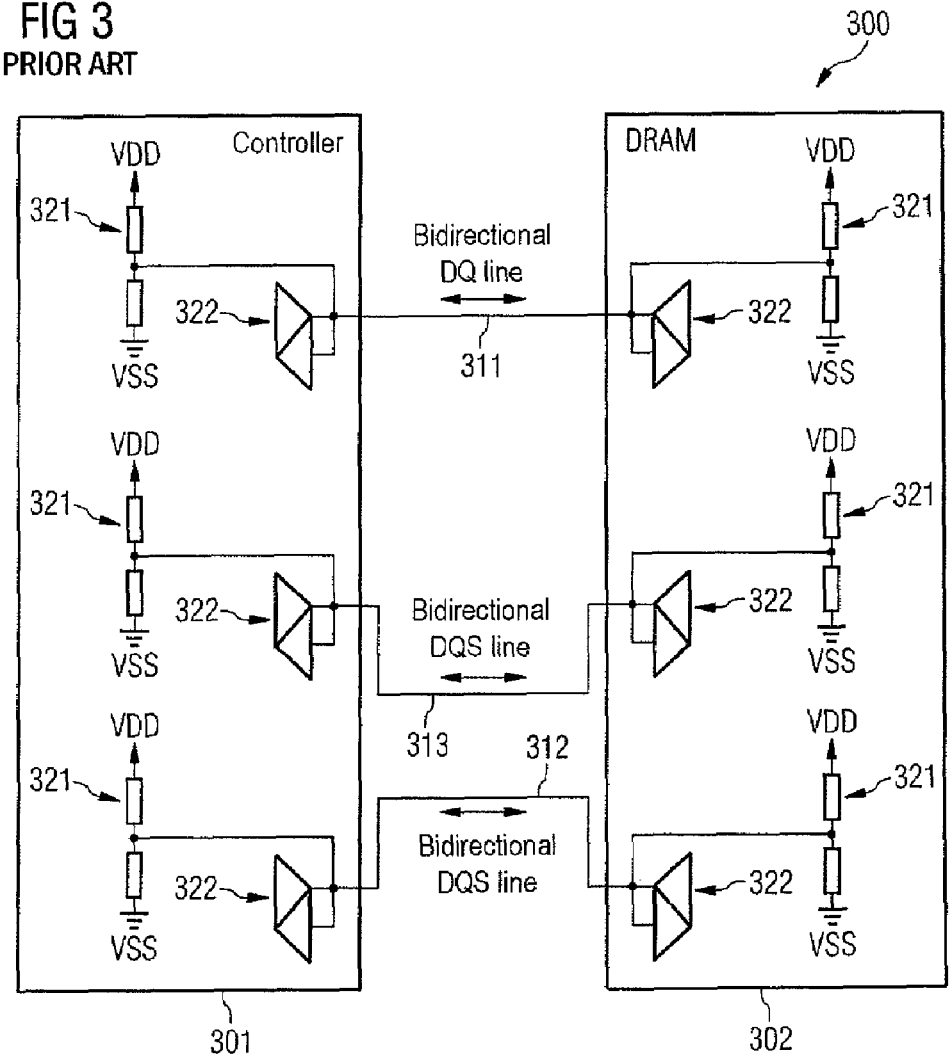

DQS SIGNALING IN DDR-III MEMORY SYSTEMS WITHOUT PREAMBLE

CROSS REFERENCE TO RELATED APPLICATION

This application claims priority under 35 USC § 119 to German Application DE 10 2004 042 173.0, filed on Aug. 31, 2004, entitled "DQS Signaling in DDR-III Memory Systems Without Preamble," the entire contents of which are hereby incorporated by reference.

FIELD OF THE INVENTION

The present invention relates to a data transmission circuit, particularly a bus circuit, a point-to-point data transmission circuit, a point-to-multipoint data transmission circuit, or a multipoint-to-point data transmission circuit, for use in a DDR memory chip communication circuit.

BACKGROUND

In DDR1 and DDR2 data bus systems used, for example, in PCs, servers, workstations, notebooks, and the like, bidirectional buses are used for data transmission. In this context, for example, eight data lines are routed in parallel from a controller to the DRAM (Dynamic Random Access Memory). The "DQ (Data Queue) signals" carried on these lines are synchronized to a "DQS (Data Queue Strobe) signal" carried on a further line, which is parallel to the data lines for the DQ signals. This DQS signal is transmitted in sync with the source, i.e., in the same direction as the DQ signals. If neither write access nor read access is taking place on the bus, the signals are in a "high impedance mode," i.e., the lines are driven or terminated neither by the DRAM nor by the controller. The signals lock onto a "tristate level," i.e., a level situated between the range of a definite 1 level (high level) and the range of a definite 0 level (low level). In this case, the DQS signal may encounter a special case.

The DQS signaling in data bus systems based on the DDR2 specification can be operated in differential fashion. In this context, two DQS signals are used, namely a DQS signal and a /DQS signal, which is the inverse of the DQS signal. During the actual data transmission operation, the DQS signals change their respective state from a high level to a low level and vice-versa at the clock frequency specified by a clock generator signal. In this case, the respective crossing of the DQS signals, i.e., the zero crossing of the differential signal DQS–/DQS, determines the timing of the data transmission operation. In particular, crossing of the DQS signals denotes a time at which the data signals transmitted on the DQ lines reach their intended state and should have met any "setup and hold conditions."

This mode of operation is also preferred at clock frequencies above that of the DDR2-667 standard due to advantages of the differential signaling. A difficulty in this case is that a DRAM receiver needs to recognize when the preamble is driven on the bus. The preamble is the period after the DQS signal has left the tristate and is held at a low level up to the first data transmission, while the /DQS signal by definition likewise leaves the tristate and is held at a high level up to the first data transmission.

The DRAM specification allows a relatively large range in which the preamble needs to start (clock edge ±0.25 tck) and specifies only a very short preamble time (0.35 tck). For a DRAM connected to the bus, for example, these time-critical specification presets mean that it is very difficult to recognize that the DQS signal is definitively no longer in tristate, i.e., that the preamble has been initiated, and that the next DQS edge therefore needs to be used to determine the data transmission timing. Specifically in the case of DDR3 with data rates of up to 1.6 Gb/s per pin and bit times of 625 ps, conventional methods of recognizing the first data correctly are difficult or even impossible to implement.

One possible solution to this problem of the DQS signal was that the controller disconnects the DQS signal only during reading, and accordingly always keeps the DQS and /DQS signals at a defined level. This consumes an unnecessary amount of power, however, and therefore does not represent a satisfactory solution. Similarly, various complex receiver implementations exist that recognize a correspondingly short preamble. Besides their complexity, however, these also have other associated drawbacks, such as increased input capacity, which impairs the signal integrity of the input signals at high data rates.

FIG. 3 shows a conventional data bus system 300 based on the DDR2 specification in schematic form that includes a controller 301 and a DRAM 302 connected to one another by a bidirectional DQ line 311 for data transmission. To synchronize the data transmission, the controller 301 and the DRAM 302 are additionally connected to one another by a bidirectional DQS line 312 and a bidirectional /DQS line 313 for interchanging differential DQS signals. Both the controller 301 and the DRAM 302 have terminations 321 and transmission and reception amplifiers 322, which are respectively connected to an appropriate end of one of the aforementioned lines. The terminations 321 include two resistors configured as voltage dividers. The resistors normally each having a resistance value around 120. Resistance values around 100 Ω, 150 Ω or 300 Ω are likewise usual.

During a write operation, i.e., during data transmission via the bus, the termination 321 is first turned on before the transmission amplifier 322 (denoted as controller driver) in the controller 301 drives the associated line to a high or low level. The termination 321 helps to prevent reflections. The termination 321 means that at the start of a write operation both DQS and /DQS have a midlevel signal level situated between the supply voltage VDD and the common grounding system VSS, i.e., at (VDD+VSS)/2. As described above, the driving of the DQS line 312 to a zero level up to the first genuine (i.e., data-transmitting) edge is called the preamble. The write operation then takes place. After the last written bit, a postamble for the DQS occurs. After that, the driver 322 on the controller 301 disconnects. Only then is the termination 321 disconnected, which ensures that the DQS and /DQS lines 312, 313 are respectively pulled back to the midlevel signal level.

The procedure described above is shown graphically in schematic form in FIG. 4. The figure shows the profiles of a clock generator signal labeled clock signal, a command signal labeled CMD signal, a DQS signal drawn in solid lines, a /DQS signal drawn in dashed lines, and a DQ signal.

The DQS and /DQS signals are at the midlevel signal level before the write operation. As preamble, the DQS signal is driven to a low level and the /DQS signal is driven to a high level. Changes to the state of the DQS signal or of the /DQS signal, which follow the preamble determine the timing of the data transmission taking place with the DQ signal, as described above. Following the data transmission, the DQS and /DQS signals return to the midlevel signal level.

SUMMARY

A data transmission circuit according to the present invention is, for example, a data transmission bus, a point-to-point data transmission circuit, a point-to-multipoint data transmission circuit or a multipoint-to-point data transmission circuit, or a part of such a data transmission bus, data transmission circuit, or corresponding data transmission system.

The chip end of a data line is connected to a first or further supply voltage line by a pull-up or pull-down resistor. The pull-up or pull-down resistor keeps the data line at a defined signal level. Since no undefined levels are to be expected on the data line, a time-consuming preamble is not required for initiating a read or write operation, which benefits the transmission rate of a data transmission circuit equipped with such a data line, for example. In addition, since resistors can be fabricated without significant additional complexity, the corresponding supply voltage lines can be found typically at a location favorable for expedient arrangement of such pull-up or pull-down resistors, for example, for terminating the data line. The choice of whether the data line is to be connected via a pull-up resistor to a positive supply voltage line or via a pull-down resistor to another, less positive, grounded, or negative supply voltage line is made accounting for the intended defined level.

A data line based on the present invention has an on die termination provided at one or both ends of the data line. A termination is known to help prevent disruptive signal reflections on a signal transmission line. A termination thus likewise helps to increase the possible transmission rate of a data transmission circuit with appropriate equipment.

A termination is, for example, in a form such that it can either be turned on or turned off to prevent unwanted current losses via the termination, which is, for example, a resistor bridge, at times at which no termination is required. In addition, termination from disrupting a defined level produced by a pull-up or pull-down resistor based on the invention, for example, can be prevented. The termination is turned on or turned off preferably by one or more control circuits associated with the data transmission circuit. This coordinated with the respective operating state and/or a predetermined timing, for example.

A termination is symmetrical, i.e., has a pull-up path and a pull-down path whose impedance values are (relatively) identical. The pull-up or pull-down resistor based on the present invention can be part of a termination. If the termination is symmetrical and can be turned on and off, such an arrangement can be recognized from its asymmetry when the termination is in the off state and is complemented by identical impedance values both in the pull-up path and in the pull-down path when the termination is turned on.

Similarly, the data transmission circuit of the present invention is operated with a timing by which terminations to be turned on for the respective operating state are not turned on until the drivers to be activated for the respective operating state have been activated. This prevents a termination from disrupting a defined level produced by a pull-up or pull-down resistor based on the invention, for example, before the level is determined definitively by the driver. As mentioned above, such timing is preferably produced through appropriate design of one or more control circuits associated with the data transmission circuit. At this juncture, a data transmission circuit, for example, a bus, is typically connected to a plurality of drivers activated in succession in a sequence arising from the circumstances such that the data transmission circuit has a level imposed that varies over time and represents transmission of a signal or information from one currently driving data transmission element (for example, a bus element) to other data transmission elements (which are currently not driving). The time reference for the temporal variation in the level of a respective data or control line of the data transmission circuit (for example, of a bus line), for transmitting information for a clock signal to which data transmission elements have access, is referred to as timing.

The driver or drivers of a respective data transmission element, i.e., of an element which uses the data transmission circuit to communicate with other elements connected to the data transmission circuit, are typically physically separate from those of another data transmission element. To produce common timing, a data transmission element can act as a data transmission controller (for example, a bus controller) that prescribes the timing by appropriate signaling on the data transmission circuit. Preferably, however, timing constraints are predetermined that allow the individual data transmission elements to agree on a common timing at local level intermittently, permanently, or for a single transmission operation. For example, the individual data transmission elements or the data transmission controller may be equipped with a control circuit as mentioned above.

A system for data transmission according to the present invention includes a data connection is connected both to a termination circuit that can be turned on and turned off and to one end of a pull-up or pull-down resistor whose other end is connected to a positive or to a less positive, grounded, or negative supply voltage line. The pull-up or pull-down resistor helps to keep the signal level on the data connection at a defined signal level, which entails the aforementioned advantages.

The design and form of the data connection preferably permit connection to a respective data line, so that the defined signal level can also be transmitted to an appropriate data line and consequently to a remote data connection. For example, such a data connection may be implemented as a pin on an appropriate semiconductor chip. Such a data transmission system has a data reception and/or transmission circuit, connected to a respective data connection, for receiving and sending data signals via a respective data line as described above.

Typically, such a data transmission system has a multiplicity of such data connections, with the inventive pull-up or pull-down resistor or the inventive pull-up or pull-down resistors being connected to those data connections likewise connected to a respective termination circuit. The latter may likewise be connected to a respective data reception and/or transmission circuit. Since the aforementioned advantages can be attained particularly in connection with a driven signal, embodiments with one or more such data transmission circuits that drive a signal have special advantages.

Preferably, such a system is operated with a timing by which the termination circuits to be turned on for the respective operating state and are connected directly or by a data line to one of the pull-up or pull-down resistors are not turned on until the data transmission circuits' driver circuits to be activated for the respective operating state have been activated.

The data transmission circuit or the data transmission system according to the present invention form part of a DDR memory chip communication circuit, particularly a DDR-III memory chip communication circuit, which helps to avoid the aforementioned drawbacks of conventional DDR memory chip communication circuits.

Such a data transmission system, for example, has a bidirectional DQS line connected as a data line between two data connections and a bidirectional /DQS line connected as a data line between two data connections. Each end of the DQS line is connected to a respective pull-up resistor and each end of the /DQS line is connected to a respective pull-down resistor.

Although the present invention has been made against the background of the specific problems of a DDR-III memory chip communication circuit, particularly in view of the problems which arise in connection with signaling on the associated DQS and /DQS lines which defines the data transmission timing, the invention can be used appropriately in many similarly placed situations, i.e., even in other data transmission systems. In connection with DQS or /DQS signaling, the DQS and /DQS lines are kept at a defined signal level outside of data transmission operation to dispense with a preamble that recognizes the start of a data transmission operation.

The DQS signals (DQS and /DQS) in line with one exemplary embodiment of the present invention are provided with a further resistance in addition to the ODT (On Die Termination). The /DQS is provided with a resistance after VDD, and the DQS is provided with a resistance after VSS. If the data transmission circuit (for example, a bus) is now switched to a "tristate" state in which neither a high level nor a low level is driven, the DQS and /DQS signals remain at a defined signal level in line with the pull-up or pull-down. The problem of the excessively short preamble, which has been to find DRAM communication circuits, particularly in the case of DDR2 and DDR-III memory chip communication circuits, is thus unnecessary. In fact, no preamble is necessary any more. The DRAM can turn on the respective DQS and DQ reception amplifiers at any time (particularly when it is expecting data in connection with a data transmission operation), without having to expect an undefined DQS signal level at the inputs.

Accordingly, without using up the power of a driver, it is possible to introduce the pull-up or pull-down resistors serve as holding resistors and to choose a suitable driver or ODT timing is selected to prevent the DQS signals from assuming a disadvantageous unwanted midlevel level.

A system for transmitting data includes a data connection for connection to a respective data line; and a data reception and/or transmission circuit, connected to a respective data connection, for receiving and sending data signals via the respective data line. The data connection connected to a data reception and/or transmission circuit is connected to a respective termination circuit which can be turned on and turned off. The data connection connected to a data reception and/or transmission circuit is connected to one end of a pull-up or pull-down resistor whose other end is connected to a positive or to a less positive, grounded or negative supply voltage line. The system is operated with a timing with which the termination circuits to be turned on for the respective operating state and which are connected directly or by a data line to one of the pull-up or pull-down resistors are not turned on until the data transmission circuits' driver circuits to be activated for the respective operating state have been activated. The system forms part of a DDR-III memory chip and/or of a DDR-III memory controller, particularly part of a DDR-III memory chip communication circuit. The system has a bidirectional DQS line connected as a data line between two data connections and also a bidirectional /DQS line connected as a data line between two data connections, each end of the DQS line is connected to one of the pull-down resistors; and each end of the /DQS line is connected to one of the pull-up resistors.

A data transmission circuit includes at least one data line which has an on die termination which can be turned on and turned off. The chip end of the data line is connected to a positive or to a less positive, grounded or negative supply voltage line by a pull-up or pull-down resistor. The data transmission circuit forms part of a DDR-III memory chip communication circuit.

A data transmission circuit is operated with a timing with which the termination circuits which are to be turned on for the respective operating state are not turned on until the drivers to be activated for the respective operating state have been activated. The data transmission circuit forms part of a DDR-III memory chip communication circuit.

BRIEF DESCRIPTION OF THE FIGURES

The invention and details thereof are explained in more detail below with reference to the drawing using exemplary embodiments without this intending to limit the respective fundamental inventive concept in any way, since the teaching conveyed by the invention places numerous configuration variants at the disposal of the person skilled in the art without departing from the scope of the invention. In the drawing:

FIG. 1 shows a data transmission system based on the present invention;

FIG. 2 shows the DQS timing of a data transmission system based on the present invention;

FIG. 3 shows a data transmission system based on the prior art; and

DETAILED DESCRIPTION

Figure 4:
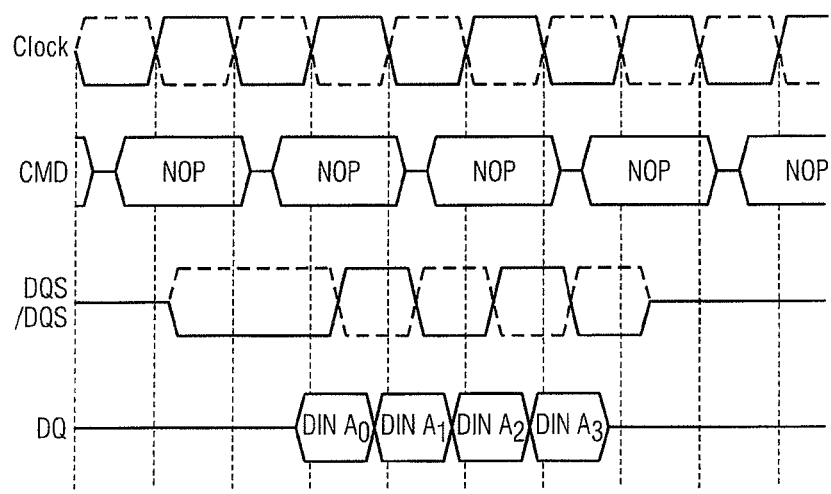
FIG. 4 shows the DQS timing of a data transmission system based on the prior art.

FIG. 1 schematically shows a system 100 for data transmission that includes a controller 101, for example, a controller chipset, and a DRAM 102, for example, a DDR-III memory chip, which are connected to one another by one or more bidirectional DQ line(s) 111 for data transmission. To synchronize the data transmission, the controller 101 and the DRAM 102 are additionally connected to one another by a bidirectional DQS line 112 and a bidirectional /DQS line 113 for interchanging preferably differential DQS signals. Both the controller 101 and the DRAM 102 have terminations 121 and transmission and reception amplifiers 122, which are respectively connected to an appropriate end of one of the aforementioned lines. The terminations 121 include two resistors configured as voltage dividers. The resistors are each able to have a resistance value around 120Ω, for example. The DQS line is connected to a supply voltage VSS via a pull-down resistor 124 both in the controller 101 and in the DRAM. The /DQS line is connected to a supply voltage VDD via a pull-up resistor 123 both in the controller 101 and in the DRAM.

The pull-up and pull-down resistors 123, 124 in the exemplary embodiment shown have a resistance value of approximately 50 kΩ. Other resistance values may also be used in accordance with the invention. In particular, resistance values for the pull-up resistors 123 that differ from the resistance values of the pull-down resistors 124 can be selected. It is also possible to select different resistance values from among the pull-up and pull-down resistors 123, 124. When selecting a suitable resistance value for a respective pull-up or pull-down resistor 123, 124, for example, choices between a large resistance value for checking leakage currents and a small resistance value for relatively quickly pulling up and pulling down the corresponding signal level are considered. Particularly in the latter case, expected parasitic capacitances in connected driver circuits 122 and/or lines 112, 113, for example, are considered. A similar situation applies to the choice of resistance values for the terminations 121. Likewise, when selecting a suitable transmission and reception amplifier 122, which may also be in the form of separate units, and selecting suitable means for performing the pilot and/or control tasks of the elements of the invention that need of piloting and/or control. These tasks include, for example, turning on and turning off the terminations 121 and the transmission and reception amplifiers 122.

During data transmission using the data communication circuit, the transmission amplifier 122 in question is first turned on, which drives the associated line to a corresponding high or low level. The termination 121 is connected in order to avoid reflections. Due to the respective pull-up or pull-down resistor 123, 124, both the DQS line 112 and the /DQS line 113 have a defined low or high level at the start of a data transmission operation.

Since the termination 121 is not turned on until after the respective transmission amplifier 122 serving as a driver, the termination 121 causes no significant dissipation of the DQS or /DQS signal level in the direction of a midlevel level; the signal level is determined by the transmission amplifier 122. The degree of signal reflections is influenced by the termination 121.

The fact that the DQS and /DQS lines 112, 113 assume an appropriately defined low or high level even before an actual data transmission operation due to the respective pull-up or pull-down resistor 123, 124 means that a first zero crossing in the differential signal (which zero crossing identifies the actual start of a data transmission operation) is unmistakable between the respective levels of the DQS and /DQS lines 112, 113. Accordingly, it is possible to dispense with a preamble without needing to worry about timing difficulties and corresponding data transmission errors particularly at the start of a data transmission operation.

FIG. 2 shows the above-described response of the DQS timing in a data transmission system based on the invention in schematic form. It shows a CLK signal, which serves as clock generator signal, i.e., for determining the data transmission frequency, and a DQS signal and a /DQS signal (which by definition is the inverse of the DQS signal).

During the actual data transmission operation, the DQS signals change their respective state from a high level to a low level and vice-versa at the clock frequency specified by the CLK signal. In this case, the respective crossing of the DQS signals, i.e., the zero crossing of the differential signal (=DQS minus /DQS), which ideally occurs at the zero crossing of the DQS signals, determines the timing of the data transmission operation. In particular, a crossing of the DQS signals denotes a time at which the data signals transmitted on the DQ lines should have reached their intended state.

Pull-up and pull-down resistors 123, 124 mean that the DQS signals assume a corresponding low or high level even before an actual data transmission operation, i.e., even before the illustrated turning-on of a corresponding driver 122. Even in the case of the illustrated connection of an appropriate termination 121, which, for example, takes place after the driver 122 has been turned on, the DQS signals are not pulled to a midlevel level and, since they are driven, differ insignificantly from their respective unterminated low and high levels. The result is thus a significant difference between the respective signal values of the DQS signals in the undriven unterminated state, in the high/low driven unterminated state and in the high/low driven terminated state, which difference prevents any confusion of these operating states with the crossed state of the DQS signals at the intended driven high-low or low-high transition.

The DQS signals also behave in correspondingly defined fashion after the data transmission operation, in line with the invention. In this regard, FIG. 2 shows the behavior when the termination 121 is turned off and when the driver 122 is turned off in schematic form.

Although the preferred and alternative embodiments of the invention have been disclosed and described in detail in this description, it is clear to the person skilled in the art that various changes with regard to the configuration, the manner of operation and the design of the invention can be made without departing from the inventive concept and from the scope of protection thereof. In particular, it is pointed out that the respective features of the invention, including those which are disclosed merely in combination with other features of the invention, can be combined in any configuration, apart from those which the person skilled in the art recognizes as being obviously senseless. In addition, the use of the singular or of the plural indicates only a preference and is not to be interpreted as a restriction. Apart from the cases in which the opposite is explicitly noted, the plural can be replaced by the singular and vice-versa.

It should also be mentioned that the use of the described pull-up and pull-down resistors has the drawback that the signal level when turning off the driver, if the termination is already off, as is preferred, rises from the terminated level to a full swing level, which in turn causes reflections which are no longer terminated on account of the high resistance of the drivers.

Since the on die termination is normally switchable, the controller can also use part of the on die termination for this pull-up path or pull-down path. In other words, instead of turning off the on die termination fully after a read operation, it is possible for only the pull-up path to be interrupted in the case of the DQS and for only the pull-down path to be interrupted on the /DQS. As a result, the resistance of the relatively low-resistance on die termination is used to retain the level. This resistance is small enough to act as a termination as well. The disconnection operation can be initiated by the last crossing of the DQS signals, for example. In this way, the pull-up becomes active before the memory arrangement turns off the DQS driver. In the case of a write operation, the controller can ensure relatively easily that the pull-up becomes active, since the controller itself drives the DQS.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

What is claimed:

1. A system comprising:

at least one data line connected to a data reception and/or transmission circuit and to an on die termination that is configured to turn on and off and is further configured to provide a termination voltage to the data line in its on state;

wherein a chip end of the at least one data line is connected either by a pull-up resistor to a positive supply voltage line, such that a voltage level of the data line is higher than a voltage level of the termination voltage, or by a pull-down resistor to a less positive, grounded or negative supply voltage line, such that a voltage level of the data line is lower than a voltage level of the termination voltage.

2. The system of claim 1, wherein the system is configured to operate with a timing by which termination circuits to be turned on for a respective operating state are not turned on until drivers to be activated for the respective operating state have been activated.

3. The system of claim 1, where the system forms part of a Double Data Rate (DDR)-III memory chip communication circuit.

4. A system comprising:
   a data connection connected to a respective data line; and
   a data reception and/or transmission circuit connected to the data connection and configured to send and receive data signals via the respective data line;
   wherein the data connection is further connected to an on die termination that is configured to turn on and off and in its on state is configured to provide a termination voltage to the respective data line, a chip end of the data line is connected either by a pull-up resistor to a positive supply voltage line, such that a voltage level of the respective data line is higher than a voltage level of the termination voltage, or by a pull-down resistor to a less positive, or grounded, or negative supply voltage line, such that a voltage level of the respective data line is lower than a voltage level of the termination voltage.

5. The system of claim 4, wherein the system is is configured to operate with a timing by which termination circuits to be turned on for a respective operating state and connected directly or by data line to one of the pull-up or pull-down resistors are not turned on until driver circuits of the data transmission circuits to be activated for the respective operating state have been activated.

6. The system of claim 5, where the system forms part of a Double Data Rate (DDR)-III memory chip and/or of a Double Data Rate (DDR)-III memory controller.

7. The system of claim 6, wherein the system forms part of a part of a Double Data Rate (DDR)-III memory chip communication circuit.

8. The system of claim 4, wherein the system includes a bidirectional Data Query Strobe (DQS) line connected as a data line between two data connections and a complementary bidirectional Data Query Strobe (DQS) line connected as a data line between two data connections, each end of the Data Query Strobe (DQS) line is connected to a respective pull-down resistor such that a voltage level of the Data Query Strobe (DQS) line is higher than a voltage level of the termination voltage, and each end of the complementary Data Query Strobe line is connected to a respective pull-up resistor such that a voltage level of the complementary Data Query Strobe (DQS) line is higher than a voltage level of the termination voltage.

9. The system of claim 1, wherein the on die termination comprises at least one resistor.

10. The system of claim 1, wherein the system further comprises a controller connected with a memory circuit.

11. The system of claim 4, wherein the on die termination comprises at least one resistor.

12. A method of transmitting data using a system comprising a data reception and/or transmission circuit connected with a data connection via a data line, the method comprising:
   facilitating a connection between the data connection and an on die termination that is configured to turn on and off; and
   turning on the on die termination so as to provide a termination voltage to the data line;
   wherein a chip end of the data line is connected either by a pull-up resistor to a positive supply voltage line, such that a voltage level of the data line is higher than a voltage level of the termination voltage, or by a pull-down resistor to a less positive, or grounded, or negative supply voltage line, such that a voltage level of the data line is lower than a voltage level of the termination voltage.

* * * * *

UNITED STATES PATENT AND TRADEMARK OFFICE
CERTIFICATE OF CORRECTION

| | |
|---|---|
| PATENT NO. | : 7,342,815 B2 |
| APPLICATION NO. | : 11/214067 |
| DATED | : March 11, 2008 |
| INVENTOR(S) | : Hermann Ruckerbauer et al. |

It is certified that error appears in the above-identified patent and that said Letters Patent is hereby corrected as shown below:

Column 9, Line 36: "system is is" should read -- system is --

Signed and Sealed this

First Day of July, 2008

JON W. DUDAS
*Director of the United States Patent and Trademark Office*